United States Patent
Lee et al.

(10) Patent No.: US 7,482,871 B2
(45) Date of Patent: Jan. 27, 2009

(54) CMOS AMPLIFIER OF FILTER FOR ULTRA WIDEBAND APPLICATION AND METHOD OF THE SAME

(75) Inventors: Jung Eun Lee, Seongnam-si (KR); Hoon Tae Kim, Yongin-si (KR); Jeong Wook Koh, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 4 days.

(21) Appl. No.: 11/598,770

(22) Filed: Nov. 14, 2006

(65) Prior Publication Data
US 2007/0159247 A1    Jul. 12, 2007

(30) Foreign Application Priority Data
Jan. 9, 2006    (KR) .................. 10-2006-0002171

(51) Int. Cl.
*H03F 3/45*    (2006.01)
(52) U.S. Cl. .................................. 330/253; 330/260
(58) Field of Classification Search ......... 330/253–254, 330/260
See application file for complete search history.

(56) References Cited

U.S. PATENT DOCUMENTS

| | | | | |
|---|---|---|---|---|
| 6,989,716 | B2 * | 1/2006 | Kwon et al. | 330/254 |
| 7,196,579 | B2 * | 3/2007 | Ozawa | 330/133 |
| 7,312,660 | B2 * | 12/2007 | Koh et al. | 330/260 |

FOREIGN PATENT DOCUMENTS

| | | |
|---|---|---|
| JP | 55-60320 A | 5/1980 |
| JP | 5-22077 A | 1/1993 |
| JP | 05102755 | 4/1993 |
| JP | 7-245546 A | 9/1995 |
| JP | 9-232886 A | 9/1997 |
| JP | 2002-305428 A | 10/2002 |
| KR | 10-1992-0011061 A | 6/1992 |
| KR | 20-1993-8087 U | 5/1993 |
| KR | 10-0153153 B1 | 7/1998 |
| KR | 10-1999-0049827 A | 7/1999 |
| KR | 10-2001-0006778 A | 1/2001 |
| KR | 10-0393303 B1 | 7/2003 |
| KR | 10-0693821 B1 | 3/2007 |

\* cited by examiner

*Primary Examiner*—Robert Pascal
*Assistant Examiner*—Hieu P Nguyen
(74) *Attorney, Agent, or Firm*—Sughrue Mion, PLLC

(57) ABSTRACT

A CMOS amplifier of a filter for an ultra wideband application and a method of the same are provided. In the CMOS amplifier, an active load circuit adds a Zero location and increases a gain by MOSFETs, feeding back operation, and has a property of a high gain and a wide bandwidth. When the CMOS amplifier is applied to a biquad LPF, a high voltage linearity over about 200 mV peak-to-peak and an suitable ultra wideband property over about 320 MHz of an cutoff frequency may be achieved.

16 Claims, 6 Drawing Sheets

US 7,482,871 B2

CMOS AMPLIFIER OF FILTER FOR ULTRA WIDEBAND APPLICATION AND METHOD OF THE SAME

CROSS-REFERENCE TO RELATED APPLICATION

This application claims priority from Korean Patent Application No. 10-2006-0002171, filed on Jan. 9, 2006, in the Korean Intellectual Property Office, the disclosure of which is incorporated herein by reference.

BACKGROUND OF THE INVENTION

1. Field of the Invention

Apparatuses and methods consistent with the present invention relate to a CMOS amplifier of a filter, and more particularly, a CMOS amplifier and a method of the same for applying to a filter, for example, a Low Pass Filter (LPF), having a high voltage gain and a high gain-bandwidth product, for ultra wideband application.

2. Description of Related Art

Recently, together with development of a system for transmitting and receiving high speed wireless data, such as a mobile phone, a Digital Multimedia Broadcasting (DMB) phone, a personal digital assistant (PDA), an ultra wideband (UWB) system and the like, a high gain/wideband CMOS amplifier is required for operation of the system. As an example, an integrator and a Low Pass Filter (LPF), as shown in FIG. 1, may adopt a CMOS amplifier as an operational amplifier AMP together with a resistor R and a capacitor C and the like. Also, a CMOS amplifier may be broadly utilized in many devices, such as a High Pass Filter (HPF), a Band Pass Filter (BPF), an oscillator, a mixer and the like.

Particularly, in a UWB system using a Multi-Band Orthogonal Frequency Division Multiplexing (MB-OFDM) scheme, an LPF, which may cover a high voltage, for example, about 200 mV peak-to-peak, and having about a 235 MHz cutoff frequency, is needed for processing a Radio Frequency (RF) signal. Normally, a differential amplifier, generating an output VOUT by amplifying a differential input VIN when provided in the same structure as shown in FIG. 2, is utilized for an LPF and the like. Various techniques such as adding an additional circuit to the differential amplifier in order to process an ultra wideband signal have been developed.

Techniques such as an active R-C filter, a Gm-C filter, a metal-oxide semiconductor field effect transistor (MOSFET)-C filter, an Operational Transconductance Amplifier (OTA) and so on, for a high gain and a wideband system, have been widely developed. However, more research may be required to effectuate a high linearity in an ultra wideband system such as an MB-OFDM system.

SUMMARY OF THE INVENTION

An aspect of the present invention provides a CMOS amplifier having a high voltage gain and a gain-bandwidth product for an ultra wideband application and a low pass filter adopting the same.

An aspect of the present invention also provides a method for processing a signal to have a high voltage gain and a gain-bandwidth product.

According to an aspect of the present invention, there is provided an amplifier including: an active load circuit adding a Zero location and increasing a gain by using metal-oxide semiconductor field effect transistors (MOSFETs) feeding back between a first power source and a second power source; a current control circuit connected to the active load circuit and receiving a common bias; a signal input circuit connected to the current control circuit and receiving differential input signals; and a current source connected between the second power source and the signal input circuit, wherein the amplifier receives and amplifies the differential input signals, and outputs the amplified differential signals via two contact points between two MOSFETs of the current control circuit and the load circuit.

According to another aspect of the present invention, there is provided a method for amplifying a signal including: operating a current source connected to MOSFETs receiving differential signals; controlling, with two MOSFETs which receive a common bias, a current flowing between a load circuit and the MOSFETs receiving the differential input signals; and amplifying the received differential input signals and outputting the amplified differential signals via two contact points between the two MOSFETs which receive the common bias and the load circuit; wherein a wideband signal is processed by using an added Zero location and an increased gain via the load circuit using MOSFETs feeding back between a first power source and a second power source.

BRIEF DESCRIPTION OF THE DRAWING

The above and/or other aspects and advantages of the present invention will become apparent and more readily appreciated from the following detailed description, taken in conjunction with the accompanying drawings of which.

DETAILED DESCRIPTION OF EMBODIMENTS

Figure 1:
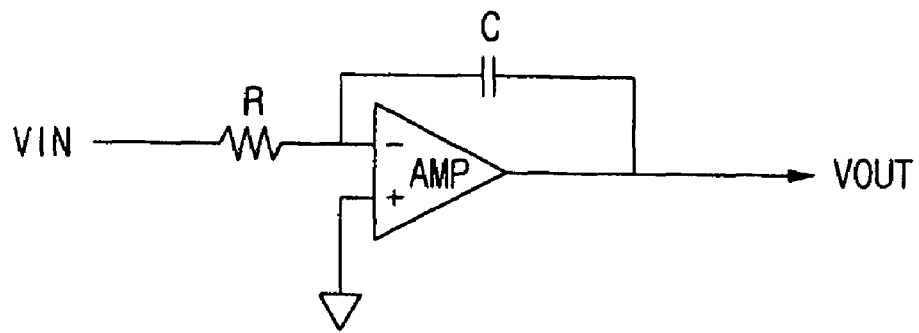
FIG. 1 is a diagram illustrating a general usage of a conventional art CMOS amplifier.

Reference will now be made in detail to embodiments of the present invention, examples of which are illustrated in the accompanying drawings, wherein like reference numerals refer to the like elements throughout. The embodiments are described below in order to explain the present invention by referring to the figures.

Figure 3:
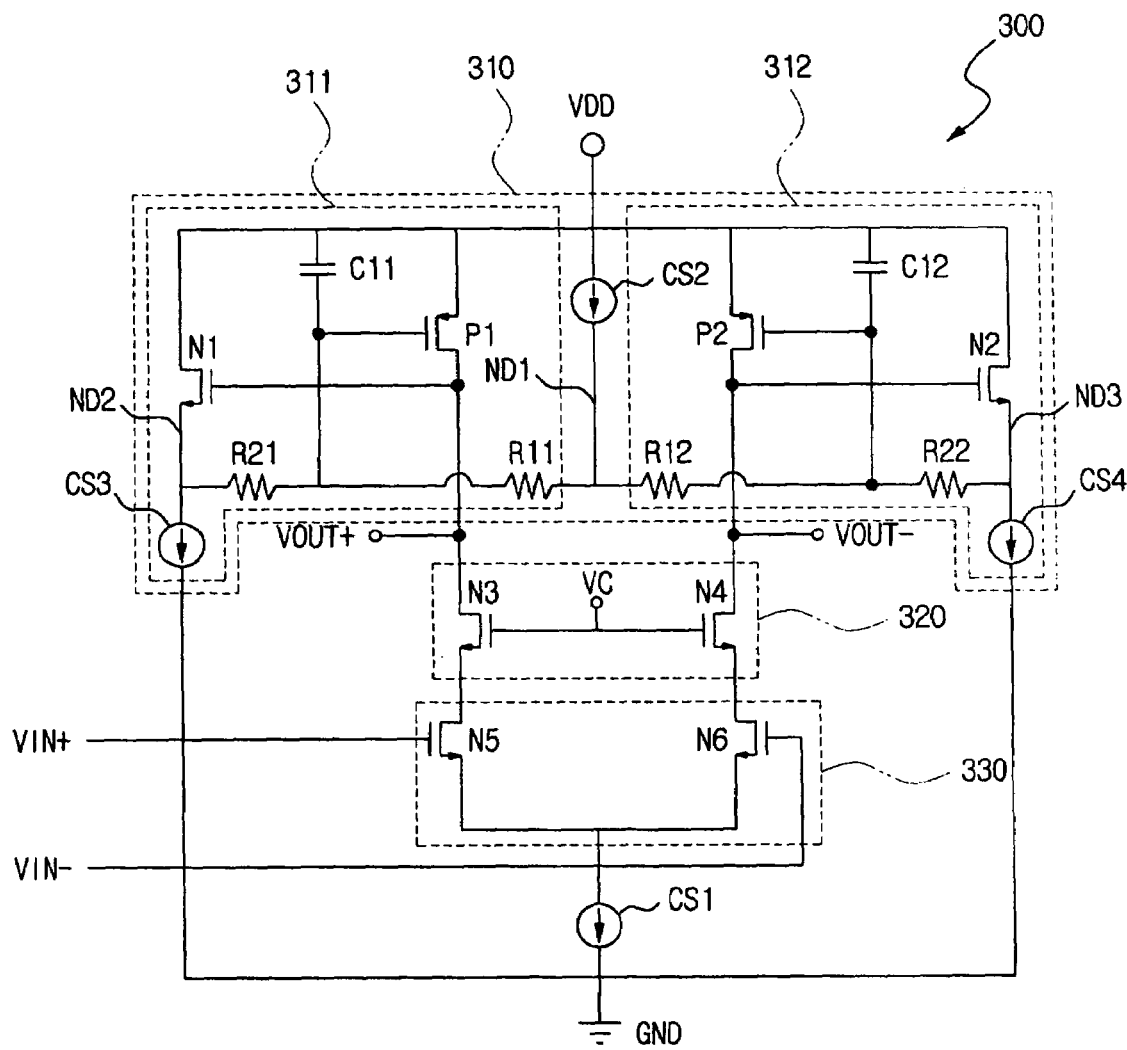
FIG. 3 is a diagram illustrating a CMOS amplifier according to an embodiment of the present invention.

FIG. 3 is a diagram illustrating a CMOS amplifier 300 according to an embodiment of the present invention. Referring to FIG. 3, the CMOS amplifier 300 includes an active load circuit 310, a current control circuit 320, a signal input circuit 330 and a current source CS1.

Figure 2:
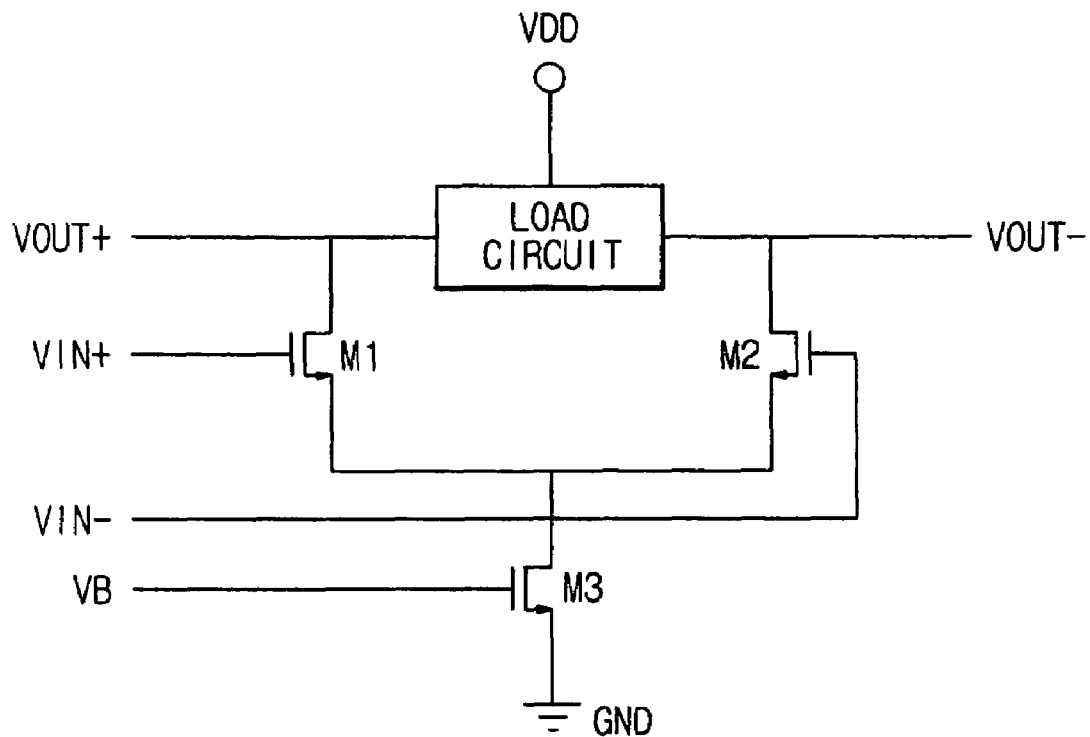
FIG. 2 is a diagram illustrating an example of a specific circuit of a general CMOS amplifier in the conventional art.

In order to implement a high voltage gain and a high gain-bandwidth product (GBW), the CMOS amplifier 300 also includes the active load circuit 310 which is designed to have a predetermined gm (transconductance) with active devices, such as MOSFETs, and passive devices, such as a resistor and a capacitor. In comparison to a structure of a general differential amplifier, of which a load may include passive devices, such as a resistor, a capacitor and an inductor, as shown in FIG. 2, the CMOS amplifier 300 may be applied to a high speed wireless data system such as a UWB system of a MB-OFDM scheme requiring a wideband and a high gain according to an added Zero location and an increased gain of its transfer function by the active load circuit 310. The Zero location may be added by a $gm_n$ value of P-channel MOSFETs, P1 and P2, feeding back in the active load circuit 310 and increased by a $gm_n$, value of N-channel MOSFETs, N1 and N2, feeding back in the active load circuit 310.

The active load circuit 310 is provided with the current source CS2 connected between a first power source VDD and a common contact point ND1 and active feedback circuits 311 and 312, symmetrical with each other, connected between two terminals of the current source CS2 and a second power source GND. The current source CS2 may be a MOSFET allowing a predetermined current flow between two terminals according to a predetermined bias. As an example, the current sources CS1/CS2 allow a predetermined current flow between a source and a drain of a MOSFET, similar to the MOSFET M3 in FIG. 2. Hereinafter, current sources to be described below may have the same structure as above.

The first active feedback circuit 311 is connected between two terminals of the current source CS2 and the second power source GND and connected to a current control source 320 at one contact point VOUT+. The second active feedback circuit 312 is connected between two terminals of the current source CS2 and the second power source GND and connected to the current control circuit 320 at one contact point VOUT−.

The active feedback circuits 311 and 312, having symmetrical devices with each other, include capacitors C11/C12, P-channel MOSFETs P1/P2, first resistors R11/R12, N-channel MOSFETs N1/N2 and second resistors R21/R22.

One terminal of each of the capacitors C11/C12 is connected to a first power source VDD. The capacitors C11/C12 may have the same value in order to maintain a symmetrical configuration. In each of the P-channel MOSFETs P1/P2, one terminal among a source and a drain, for example one terminal of the source, is connected to the first power source VDD, a gate of each of the P-channel MOSFETs P1/P2 is connected to one other terminal of each of the capacitors C11/C12, and a remaining terminal among the source and the drain for each P-channel MOSFET P1/P2, for example the remaining terminal of the drain, is connected to one contact point VOUT+/VOUT− of the current control circuit 320.

Each one of the first resistors R11/R12 is connected between the common contact point ND1 and one of the gates of the P-channel MOSFETs P1/P2. The resistors R11/R12 may have a same resistance value for symmetry. In each of the N-channel MOSFETs N1/N2, one terminal among a source or a drain, for example one terminal of a drain, is connected to the first power source VDD, a gate of each of the N-channel MOSFETs N1/N2 is connected to the contact point VOUT+/VOUT− with the current control circuit 320, and a remaining terminal among the source and the drain of each of the N-channel MOSFETs N1/N2, for example the remaining terminal of the source, is connected to a node ND2/ND3.

Each of current sources CS3/CS4 is connected between one of the nodes ND2/ND3 and the second power source GND. Each of the second resistors R21/R22 is connected between one of the nodes ND2/ND3 and the gate of one of the P-channel MOSFET P1/P2. The resistors R21 and R22 may have the same value for a symmetrical property.

According to an operation of the active load circuit 310 having a configuration as above, a Zero location may be added and a gain may be increased in a transfer function relating to an input signal VIN and an amplified signal VOUT.

When the active load circuit 310 is analyzed according to a small signal equivalent model, the added Zero location and the increased gain property are respectively represented as, $$z = [1/C] * [R1/(R2+1/gm_n)]$$ [Equation 1]

$$G \propto (1+R2/R1) * [1/gm_p]$$ [Equation 2]

In Equation 1, z indicates a Zero location in $\omega(2\pi f)$ unit, C indicates any one of capacitors C11 or C12, R1 indicates any one of the resistors R11 or R12, R2 indicates any one of the resistors R21 or R22 and $gm_n$ indicates a gm value of any one of the N-channel MOSFETs N1 or N2. The f of the Zero location indicates a frequency of an input signal VIN. The $gm_n$ may change according to frequency.

In Equation 2, G indicates a gain of an amplified signal, i.e., an output signal VOUT for an input signal VIN, and $gm_p$ indicates a gm value of the P-channel MOSFET P1 or P2. The $gm_p$ may change according to frequency. The input signal VIN may be any one of the differential input signals VIN+ and VIN−, and the output signal VOUT may be any one of the amplified differential signals VOUT+ and VOUT−.

Figure 4:
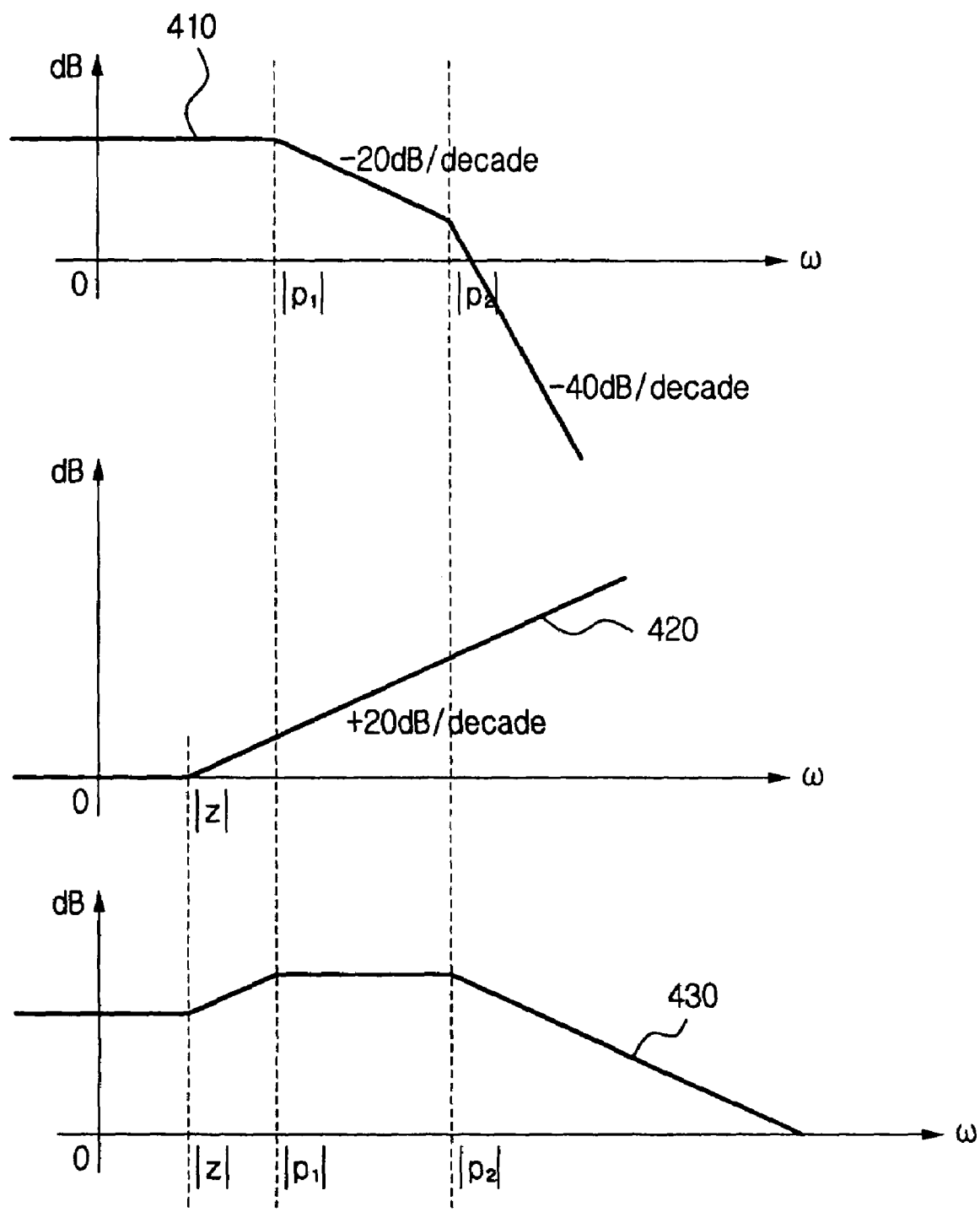
FIG. 4 is a diagram illustrating a frequency-gain of a CMOS amplifier according to an embodiment of the present invention.

As an example, when a simple differential amplifier of which a load consists of passive devices, such as resistors, capacitors, and inductors, and has a frequency-gain property similar to a curve 410 of FIG. 4, a gain-increasing property curve 420 is added from the added Zero location z. Accordingly, a frequency gain property 430 of the CMOS amplifier 300, similar to curve 430 of FIG. 4, increases from the Zero location z, curves in Pole locations of p1 and p2 so that a higher gain and a wideband property are obtained when compared with the curve 410 of FIG. 4. Particularly, a constant frequency-gain property is represented due to a balancing of gain property slopes, +20 dB/decade and −20 dB/decade, between Pole locations p1 and p2 and a gain is moderately decreased by +20 dB/decade and −40 dB/decade, at a frequency beyond p2.

The active load circuit 310 as described above is connected at the contact point VOUT+ and VOUT− with the current control circuit 320 receiving the common bias VC. The signal input circuit 330 is connected to the current control circuit 320 and has N-channel MOSFETs N5 and N6 receiving a differential input signals VIN+ and VIN−. Accordingly, two N-channel MOSFETs, N3 and N4, receiving the common bias VC from the current control circuit 320 are between the active load circuit 310 and the N-channel MOSFETs, N5 and N6, that are receiving the differential input signals VIN+ and VIN−, and control a current flowing from the active load circuit 310 to the signal input circuit 330 so that a suitable frequency-gain property is obtained. The current source CS1 is included between the second power source GND and the signal input circuit 330.

Accordingly, the CMOS amplifier 300 receives and amplifies the differential input signals VIN+ and VIN− and outputs the amplified differential signals via two contact points between two MOSFETs, N3 and N4, of the current control circuit 320 and the load circuit 310.

The CMOS amplifier 300 with a high gain and a wideband property may be applied to a Low Pass Filter (LPF), a High Pass Filter (HPF), a Band Pass Filter (BPF) and other filter for processing high speed data in a UWB system processing a multiband signal in a MB-OFDM (Multi-Band-Orthogonal Frequency Division Multiplex) scheme.

Figure 5:
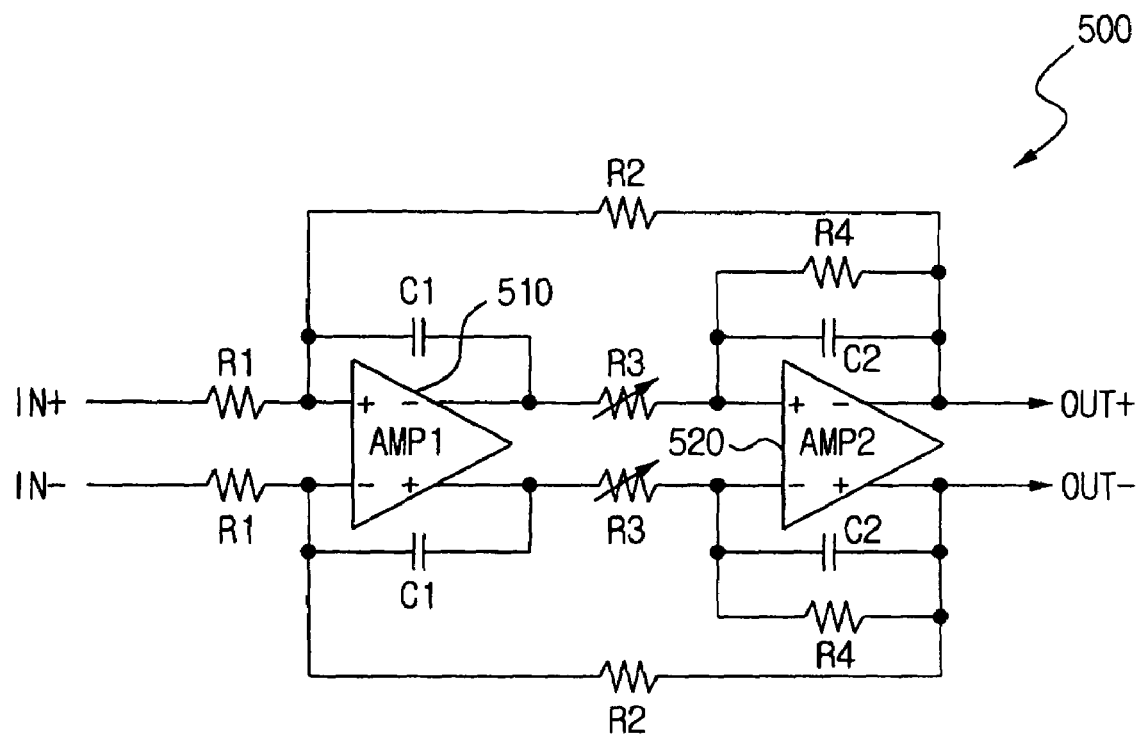
FIG. 5 is an LPF adopting a CMOS amplifier according to an embodiment of the present invention.

An instance of a biquad LPF 500 utilizing the CMOS amplifier 300 is shown in FIG. 5 according to an embodiment of the present invention. The LPF 500 includes passive devices R1, R2, R3, R4, C1 and C2, in addition to amplifiers 510 and 520 utilizing the CMOS amplifier 300, to have a property of passing a low frequency with an appropriate gain and a cutoff frequency coo. FIG. 5 is taken only as an example, in order to provide the LPF 500 with a preferred property, other devices may be provided in addition to the above passive devices. The LPF 500 may be designed to have an appropriate cutoff frequency by tuning the resistor R3 in FIG. 5. That is, the resistor R3 may be tuned so as to provide a filter property which is adaptable to temperature changes in a circuit operation and an environmental influence during a manufacturing process.

Figure 6:
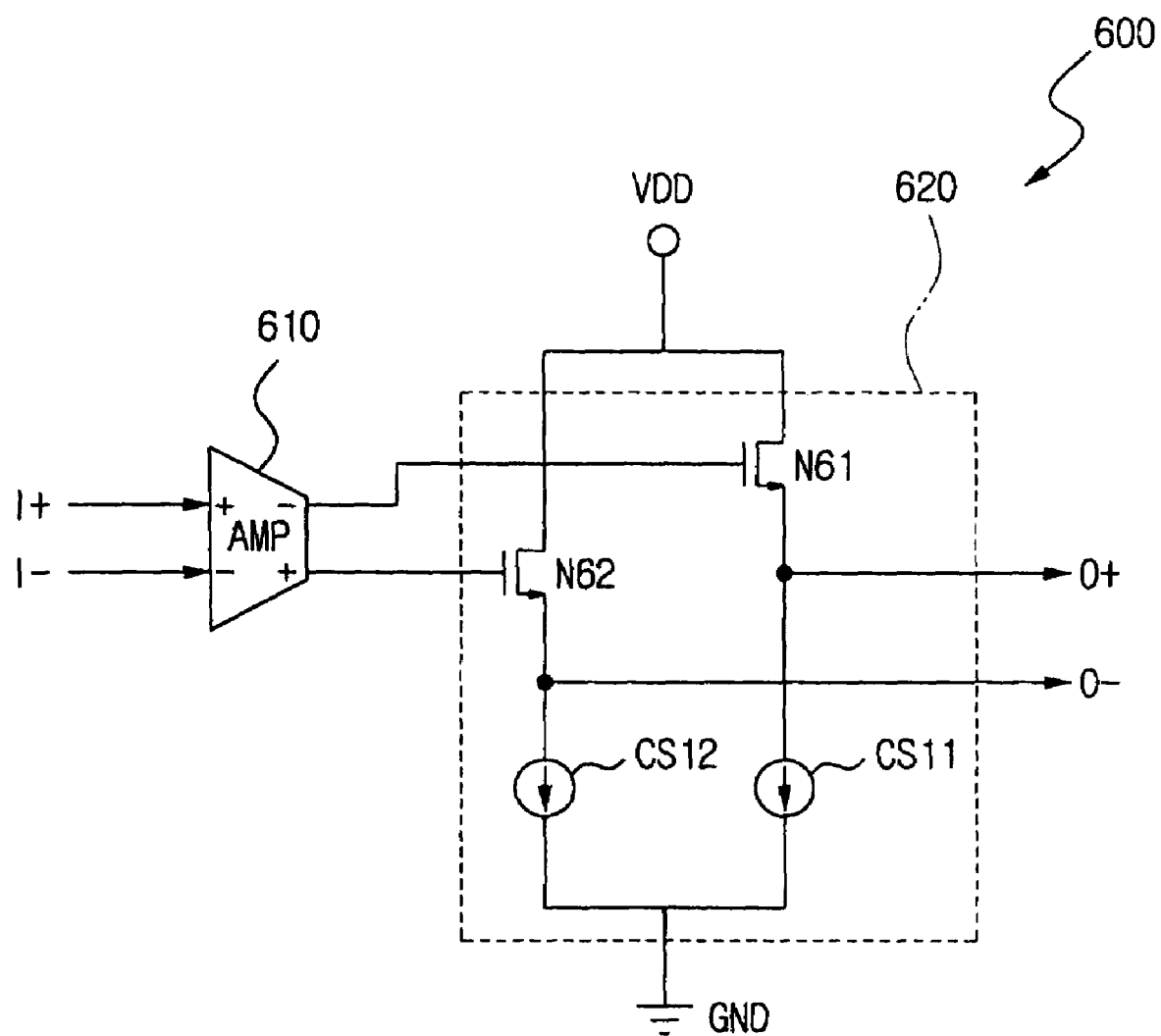
FIG. 6 is a diagram illustrating a structure in which an output buffer may be applied to CMOS amplifiers according to an embodiment of the present invention.

In FIG. 6. a circuit 600 including an output buffer 620 and a basic CMOS amplifier 610 may be applicable to the amplifiers 510 and 520 of FIG. 5.

Referring to FIG. 6, in the circuit 600, the basic CMOS amplifier 610 amplifies input differential signals I+ and I−. The output buffer 620 receives amplified differential signals from the basic CMOS amplifier 610, and outputs the buffered differential signals O+ and O−. The differential signals from the basic CMOS amplifier 610 may come from the two contact points VOUT+ and VOUT− between the load circuit 310 and the current control circuit 320 in FIG. 3.

As an example, the output buffer 620 includes N-channel MOSFETs N61 and N62 and current sources CS11 and CS12. In the first MOSFET N61, one of the source or drain terminals, for example the drain terminal, is connected to the first power source VDD, a gate is connected to the first contact point VOUT− between the load circuit 310 and the current control circuit 320, and a remaining terminal among the source or the drain, for example the remaining terminal of the source, is connected to a first output terminal O+. The first current source CS11 is connected between the first output terminal O+ and the second power source GND.

In the second MOSFET N62, either the source or drain terminal, for example the drain terminal, is connected to the first power source VDD, the gate is connected to a second contact point VOUT+ between the load circuit 310 and the current control circuit 320, a remaining terminal among the source or the drain, for example the remaining terminal of the source, is connected to a second output terminal O−. The second current CS12 is connected between the second output terminal O− and the second power source GND.

Figure 7:
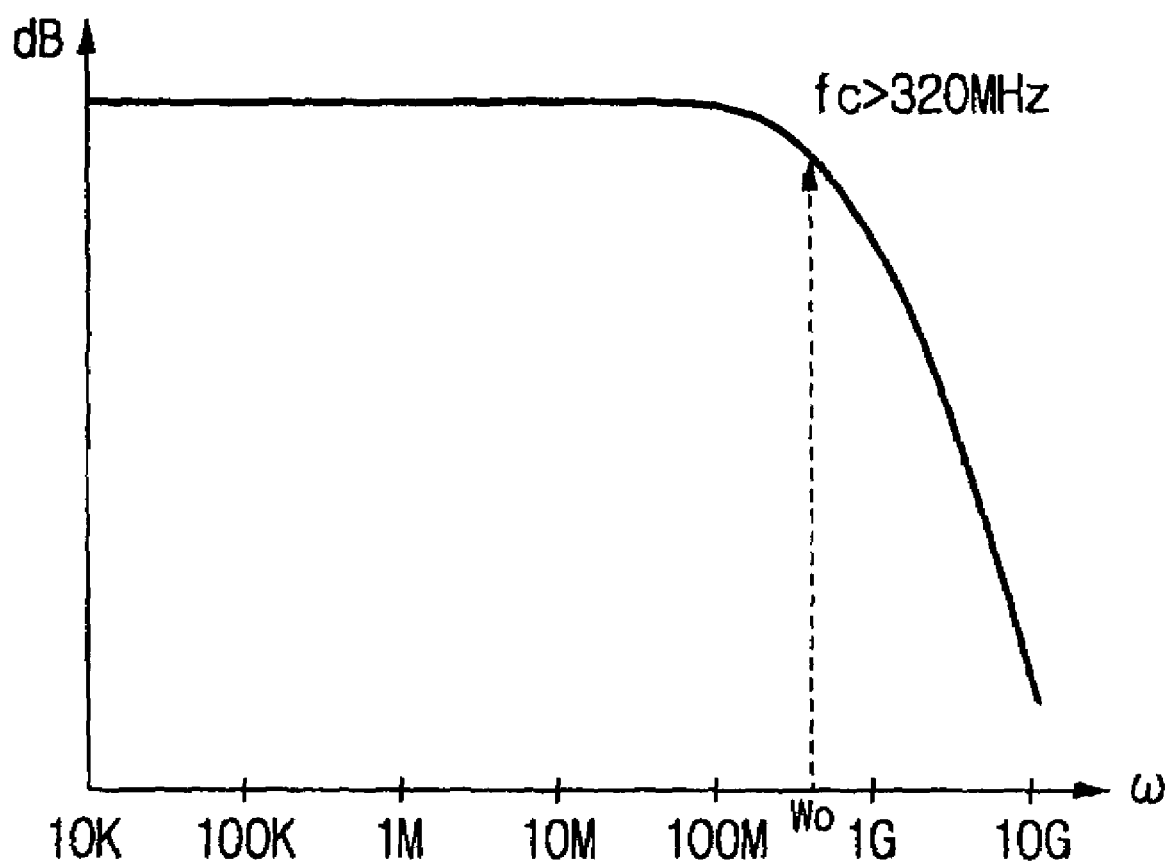
FIG. 7 is a diagram illustrating a frequency-gain property of an LPF.

In a frequency-gain property of the LPF 500 using the buffered differential signals O+ and O−, shown in FIG. 7, a 3-dB cutoff frequency ($f_c$) beyond 320 MHz and a sufficient linearity property for approximately 200 mV peak-to-peak of an input signal may be represented. The LPF 500 provided with the above property fully satisfies a wideband filter property so that a system performance may be improved in the case of adopting the filter to the UWM system of MB-OFDM scheme.

As described above, in the CMOS amplifier 300 according to an embodiment of the present invention, the active load circuit 310 has a property of a high gain and a wide bandwidth by adding a Zero location via N-channel MOSFETs, N1 and N2, arranged in a feedback configuration, and by increasing a gain via P-channels MOSFETs, P1 and P2, arranged in a feedback configuration. When the CMOS amplifier 300 is applied to the biquad LPF 500, a high voltage linearity over about 200 mV peak-to-peak and a suitable ultra wideband property over about 320 MHz of a cutoff frequency may be achieved.

As described above, in a CMOS amplifier and a low pass filter according to the present invention, a Zero location is added by an active load, a gain and a bandwidth is increased, and thus, in a communication system for transmitting and receiving high speed wireless data, such as a MB-OFDM UWB system and the like, a system performance may be improved by adopting the CMOS amplifier for a signal amplification or a signal filtering in a wideband signal processing.

The invention can also be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, and carrier waves, such as data transmission through the Internet. The computer readable recording medium can also be distributed over network coupled computer systems so that the computer readable code is stored and executed in a distributed fashion.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

What is claimed is:

1. An amplifier comprising:
    an active load circuit which adds a Zero location and increases a gain by using metal-oxide semiconductor field effect transistors (MOSFETs) feeding back between a first power source and a second power source;
    a current control circuit which receives a common bias and is connected to the active load circuit;
    a signal input circuit which receives differential input signals and is connected to the current control circuit; and
    a current source connected between the second power source and the signal input circuit,
    wherein the amplifier receives and amplifies the differential input signals, and outputs the amplified differential signals via two contact points between two MOSFETs of the current control circuit and the active load circuit, and
    wherein the active load circuit comprises:
    a second current source connected between a common contact point and the first power source;
    a first active feedback circuit connected between two terminals of the second current source and the second power source; and
    a second active feedback circuit connected between two terminals of the second current source and the second power source and provided with devices symmetrical to the first active feedback circuit.

2. The amplifier of claim 1, wherein each of the active feedback circuits comprises:
    a capacitor in which a terminal of the capacitor is connected to the first power source;
    a first MOSFET in which one terminal among a first source and a first drain is connected to the first power source, a first gate is connected to another terminal of the capacitor, and a first remaining terminal among the first source and the first drain is connected to a contact point of the current control circuit;
    a first resistor connected between a common contact point and the gate of the first MOSFET;
    a second MOSFET in which one terminal among a second source and a second drain is connected to the first power source, a second gate is connected to the contact point of the current control circuit, and a second remaining terminal among the second source and the second drain is connected to a first node;

a third current source connected between the first node and the second power source; and a second resistor connected between the first node and the first gate of the first MOSFET.

3. The amplifier of claim 2, wherein the first MOSFET is a P-channel transistor and the second MOSFET is an N-channel transistor.

4. The amplifier of claim 2, wherein the first resistor and the second resistor have different resistance values from each other.

5. The amplifier of claim 2, wherein the current sources comprises a transistor making a current flow between two terminals according to a corresponding bias.

6. The amplifier of claim 1, further comprising:
an output buffer connected to the two contact points between the current control circuit and the load circuit.

7. An amplifier comprising:
an active load circuit which adds a Zero location and increases a gain by using metal-oxide semiconductor field effect transistors (MOSFETs) feeding back between a first power source and a second power source;
a current control circuit which receives a common bias and is connected to the active load circuit;
a signal input circuit which receives differential input signals and is connected to the current control circuit;
a current source connected between the second power source and the signal input circuit; and
an output buffer connected to the two contact points between the current control circuit and the load circuit,
wherein the amplifier receives and amplifies the differential input signals, and outputs the amplified differential signals via two contact points between two MOSFETs of the current control circuit and the active load circuit,
wherein the output buffer comprises:
a first MOSFET in which one first terminal among a first source and a first drain is connected to the first power source, a first gate is connected to a first contact point between the load circuit and the current control circuit, and a first remaining terminal among the first source and the first drain is connected to a first output terminal;
a first current source connected between the first output terminal and the second power source;
a second MOSFET in which one second terminal among a second source and a second drain is connected to the first power source, a second gate is connected to a second contact point between the load circuit and the current control circuit, and a second remaining terminal among the second source and the second drain is connected to a second output terminal; and
a second current source connected between the second output terminal and the second power source.

8. An amplifier comprising:
an active load circuit which adds a Zero location and increases a gain by using metal-oxide semiconductor field effect transistors (MOSFETs) feeding back between a first power source and a second power source;
a current control circuit which receives a common bias and is connected to the active load circuit;
a signal input circuit which receives differential input signals and is connected to the current control circuit;
a current source connected between the second power source and the signal input circuit; and
an output buffer connected to the two contact points between the current control circuit and the load circuit,
wherein the amplifier receives and amplifies the differential input signals, and outputs the amplified differential signals via two contact points between two MOSFETs of the current control circuit and the active load circuit, and wherein the amplifier and another amplifier performing the same operations as the amplifier are coupled with passive devices to be applicable to a low pass filter (LPF).

9. The amplifier of claim 8, wherein the LPF is used for an ultra wideband (UWB) system.

10. The amplifier of claim 9, wherein the UWB system processes a multiband signal of a Multi-Band-Orthogonal Frequency Division Multiplex (MB-OFDM) scheme.

11. A method of amplifying signals, the method comprising:
operating a current source connected to MOSFETs receiving differential input signals;
controlling, with two MOSFETs which receive a common bias, a current flowing between an active load circuit and the MOSFETs receiving the differential input signals; and
amplifying the received differential input signals and outputting the amplified differential signals via two contact points between the two MOSFETs which receive the common bias and the active load circuit,
wherein the active load circuit comprises:
a second current source connected between a common contact point and the first power source;
a first active feedback circuit connected between two terminals of the second current source and the second power source; and
a second active feedback circuit connected between two terminals of the second current source and the second power source and provided with devices symmetrical to the first active feedback circuit, and
wherein a wideband signal is processed by using an added Zero location and an increased gain via the active load circuit using MOSFETs feeding back between the first power source and the second power source.

12. The method of claim 11, further comprising buffering the amplified differential signals.

13. The method of claim 11, wherein an LPF is implemented by using the amplification method with passive devices.

14. The method of claim 13, wherein the LPF is used for a UWB system.

15. The method of claim 14, wherein the UWB system processes a multiband signal of MB-OFDM scheme.

16. A computer readable recording medium having embodied thereon a computer program executing a method of amplifying signals, the method comprising:
operating a current source connected to MOSFETs receiving differential input signals;
controlling, with two MOSFETs which receive a common bias, a current flowing between an active load circuit and the MOSFETs receiving the differential input signals; and
amplifying the received differential input signals and outputting amplified differential signals via two contact points between the two MOSFETs which receive the common bias and the active load circuit,
wherein the active load circuit comprises:
a second current source connected between a common contact point and the first power source;
a first active feedback circuit connected between two terminals of the second current source and the second power source; and
a second active feedback circuit connected between two terminals of the second current source and the second power source and provided with devices symmetrical to the first active feedback circuit, and wherein a wideband signal is processed by using an added Zero location and an increased gain via the active load circuit using MOSFETs feeding back between the first power source and the second power source.

* * * * *